United States Patent
Moden

(10) Patent No.: US 6,858,467 B2
(45) Date of Patent: Feb. 22, 2005

(54) METHOD FOR FABRICATING SEMICONDUCTOR PACKAGES WITH STACKED DICE AND LEADFRAMES

(75) Inventor: Walter Moden, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/334,407

(22) Filed: Dec. 31, 2002

(65) Prior Publication Data

US 2003/0089981 A1 May 15, 2003

Related U.S. Application Data

(60) Continuation of application No. 09/844,134, filed on Apr. 30, 2001, now Pat. No. 6,506,625, which is a division of application No. 09/388,323, filed on Sep. 1, 1999, now Pat. No. 6,303,981.

(51) Int. Cl.$^7$ .................. H01L 21/44; H01L 21/48; H01L 21/50
(52) U.S. Cl. .................. 438/107; 438/123; 257/666; 257/783
(58) Field of Search .................. 438/107, 109, 438/111, 118, 123; 257/666, 777, 783, 784, 787; 361/813, 814

(56) References Cited

U.S. PATENT DOCUMENTS

| | | | |
|---|---|---|---|
| 5,182,632 A | 1/1993 | Bechtel et al. | |
| 5,227,995 A | 7/1993 | Klink et al. | |
| 5,250,841 A | 10/1993 | Sloan et al. | |
| 5,266,912 A | 11/1993 | Kledzik | |
| 5,299,092 A | 3/1994 | Yaguchi et al. | |
| 5,406,124 A | 4/1995 | Morita et al. | |
| 5,437,915 A | 8/1995 | Nishimura et al. | |
| 5,543,658 A | 8/1996 | Hosokawa et al. | |
| 5,585,600 A | 12/1996 | Froebel et al. | |
| 5,674,785 A | 10/1997 | Akram et al. | |
| 5,677,566 A | 10/1997 | King et al. | |
| 5,739,585 A | 4/1998 | Akram et al. | |
| 5,763,939 A | 6/1998 | Yamashita | |
| 5,811,879 A | 9/1998 | Akram | |
| 6,252,299 B1 | 6/2001 | Masuda et al. | |
| 6,303,981 B1 | 10/2001 | Moden | |
| 6,506,625 B1 * | 1/2003 | Moden | 438/107 |

FOREIGN PATENT DOCUMENTS

| | | |
|---|---|---|
| JP | 4-320362 | 11/1992 |
| JP | 4-320365 | 11/1992 |
| JP | 5-67726 A | 3/1993 |
| JP | 5-82720 | 4/1993 |

* cited by examiner

Primary Examiner—George Fourson
Assistant Examiner—Fernando L. Toledo
(74) Attorney, Agent, or Firm—Stephen A. Gratton

(57) ABSTRACT

A semiconductor package, and a method for fabricating the package are provided. The package includes a plastic body, and a pair of stacked semiconductor dice encapsulated in the plastic body, and wire bonded to separate leadframe segments. A first leadframe segment includes lead fingers configured to support a first semiconductor die of the stacked pair, and to form terminal leads of the package. A second leadframe segment is attached to the first leadframe segment, and includes lead fingers that support a second semiconductor die of the stacked pair. The lead fingers of the second leadframe are in physical and electrical contact with the leadfingers of the first leadframe. In addition, tip portions of the lead fingers of the first leadframe segment are staggered relative to tip portions of the lead fingers of the second leadframe segment to provide space for bond wires. The lead fingers support the dice during encapsulation, and also provide a heat conductive path for transferring heat from the dice during operation. The package can be constructed using lead-on-chip leadframes and conventional semiconductor packaging equipment.

21 Claims, 7 Drawing Sheets

METHOD FOR FABRICATING SEMICONDUCTOR PACKAGES WITH STACKED DICE AND LEADFRAMES

CROSS REFERENCE TO RELATED APPLICATIONS

This application is a continuation of Ser. No. 09/844,134 filed on Apr. 30, 2001, U.S. Pat. No. 6,506,625 B1, which is a division of Ser. No. 09/388,323, filed on Sep. 1, 1999, U.S. Pat. No. 6,303,981 B1.

FIELD OF THE INVENTION

This invention relates generally to semiconductor packaging, and specifically to an improved semiconductor package having a pair of stacked dice bonded to separate leadframes and encapsulated in a plastic body. This invention also relates to a method for fabricating the package, and to an electronic assembly fabricated using multiple packages.

BACKGROUND OF THE INVENTION

A conventional plastic semiconductor package includes a semiconductor die attached to a segment of a leadframe, and encapsulated in a plastic body. One type of leadframe includes a mounting paddle that attaches to a backside of the die to support the die during encapsulation. The leadframe also includes lead fingers wire bonded to bond pads on the face of the die, then trimmed and formed into terminal leads for the package.

Another type of leadframe, known as a "lead-on-chip" (LOC) leadframe, includes lead fingers that attach directly to the face of the die to provide support during encapsulation, and the terminal leads for the package. Yet another type of leadframe comprises an organic polymer such as bismaleimide-triazine, epoxy or polyimide, reinforced with glass fibers.

In order to provide an increased circuit density and storage capability, a single semiconductor package can also include multiple semiconductor dice. For example, some semiconductor packages, known as "double die" packages, include two dice wired together with a common lead system. Other packages can include three, or sometimes more, semiconductor dice.

One consideration in fabricating multiple dice packages is heat transfer from the dice to the environment. With multiple dice contained in a package, at least twice the heat is generated during operation of the package. Some prior art multiple dice packages are not efficient in transferring heat generated by the dice. For example, packages that include organic lead frames, or lead frames with die mounting paddles, are generally not efficient at transferring and dissipating heat from the dice.

Another consideration in fabricating multiple dice packages is the efficiency of the fabrication process. Some packages require multiple encapsulation steps, which adds complexity to the fabrication process, and increases the expense of the packages. These fabrication processes can also require specialized equipment and materials.

In addition, multiple dice semiconductor packages having complex configurations may not be as reliable as conventional single die packages. In particular, the seal between the dice and package body can be compromised by the location and number of the parting lines between the dice and leadframe. Further, some multiple dice packages require complex wire bonding arrangements, such as relatively long length bond wires. These wire bonds can increase resistivity, generate parasitic signals, and adversely affect the reliability of the package.

The present invention is directed to a multiple dice semiconductor package having an efficient heat transfer path from the dice. In addition, the package has a simplified configuration, and can be fabricated using conventional equipment and materials.

SUMMARY OF THE INVENTION

In accordance with the present invention, an improved semiconductor package, a method for fabricating the package, and an electronic assembly fabricated using the package, are provided. The package includes first and second leadframe segments attached to one another, first and second semiconductor dice bonded to the leadframe segments in a stacked configuration, and a plastic body encapsulating the dice and leadframe segments.

In the illustrative embodiment, the package has the configuration of a thin small outline package (TSOP). In addition, the first leadframe segment has a lead-on-chip configuration and includes leadfingers attached to the first semiconductor die. The leadfingers on the first leadframe segment are wire bonded to bond pads on the first die, and include terminal portions that form terminal leads for the package. The second leadframe segment also has a lead-on-chip configuration, and includes leadfingers attached to the second semiconductor die, and wire bonded to bond pads on the second semiconductor die. The leadfingers on the second leadframe segment are in electrical contact with the leadfingers on the first leadframe segment. Also, the leadfingers on the second leadframe segment are staggered with respect to the leadfingers on the first leadframe segment to permit space for bond wires.

The leadfingers, in addition to providing electrical paths for the package, also provide heat transfer paths for dissipating heat generated by the dice. The leadfingers also support the dice during the encapsulation process and rigidify the package.

The method for fabricating the package includes the steps of: providing a first leadframe having leadfingers configured to form terminal leads for the package; providing a second leadframe having leadfingers configured for electrical contact with the leadfingers on the first leadframe; attaching and wire bonding first semiconductor dice to the first leadframe; attaching and wire bonding second semiconductor dice to the second leadframe; attaching the leadframes to one another with the first and second semiconductor dice arranged in stacked pairs with their circuit sides facing one another; encapsulating the stacked pairs of semiconductor dice in plastic bodies; trimming and forming the first leadfingers to form terminal leads; trimming the second leadfingers; and then optionally plating the first and the second leadfingers to maintain electrical contact therebetween. The method of fabrication can be performed using conventional equipment adapted for use with lead-on-chip dice and leadframes.

In the illustrative embodiment the electronic assembly comprises a memory module comprising a substrate and multiple semiconductor packages mounted to the substrate.

DETAILED DESCRIPTION OF THE PREFERRED EMBODIMENT

Figure 1A:
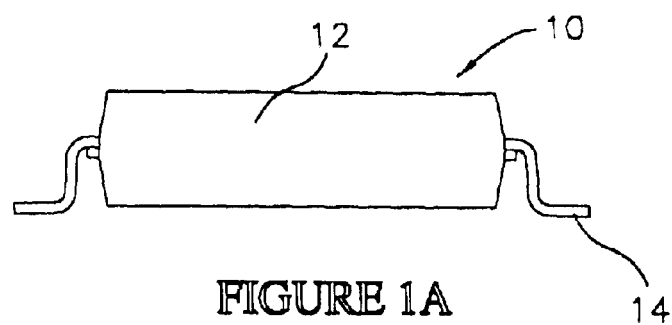
FIG. 1A is an end elevation view of a semiconductor package constructed in accordance with the invention.
Figure 1B:
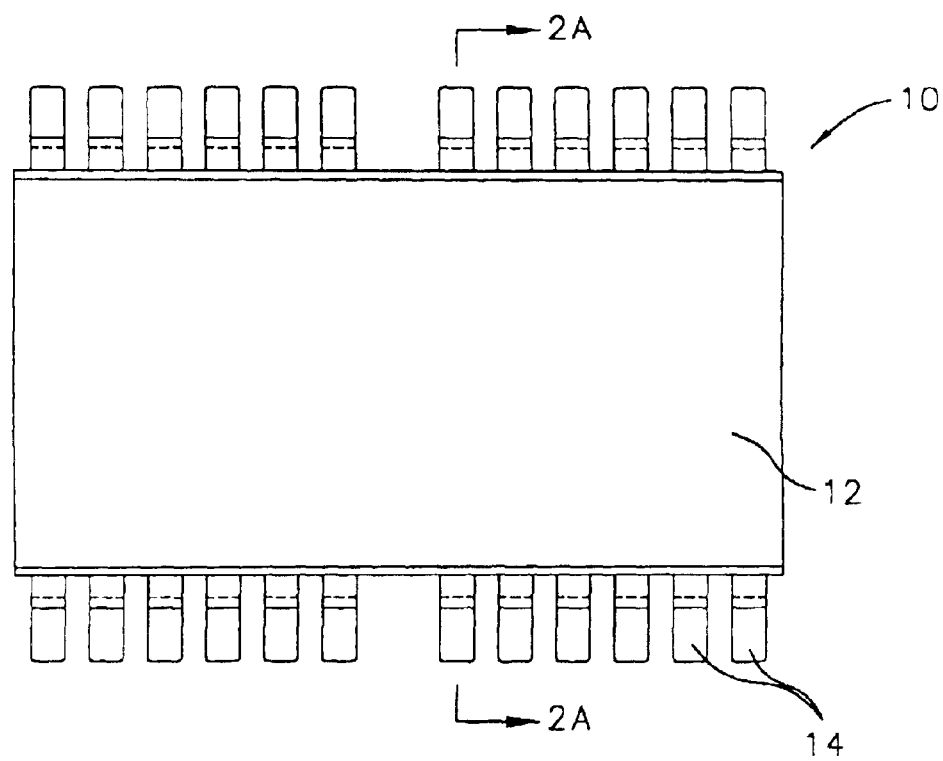
FIG. 1B is a plan view of the package.
Figure 1C:
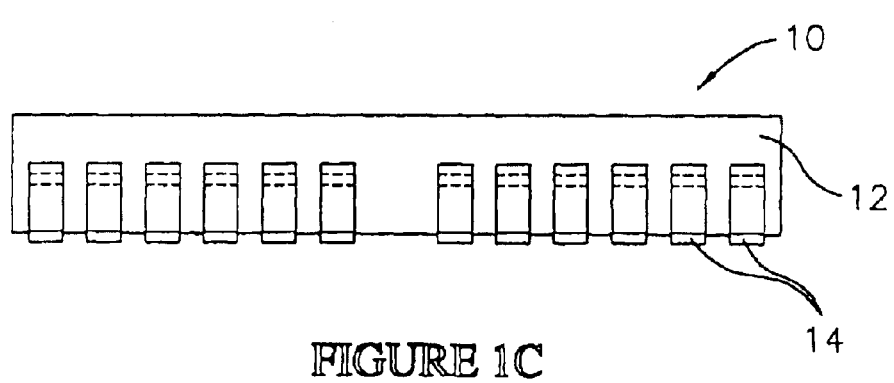
FIG. 1C is a side elevation view of the package.

Referring to FIGS. 1A–1C, a semiconductor package 10 constructed in accordance with the invention is illustrated. In the illustrative embodiment the package 10 has the configuration of a thin small outline package (TSOP). Alternately, the package 10 can have any other conventional configuration such as DIP (dual in line package), ZIP (zig zag in line package), LCC (leadless chip carrier), SOP (small outline package), QFP (quad flat pack), and SOJ (small outline j-bend).

The package 10 includes a plastic body 12 and a plurality of terminal leads 14 extending from the body 12. The terminal leads 14 are in electrical communication with the integrated circuits (not shown) contained within the package 10, and form separate electrical paths from the outside to the integrated circuits. In the illustrative embodiment, the terminal leads 14 have a gull-wing configuration to permit surface mounting of the package 10 to mating electrodes on a supporting substrate, such as a printed circuit board (PCB). The terminal leads 14 can be configured to provide a desired spacing for the package with respect to the supporting substrate.

Figure 5A:
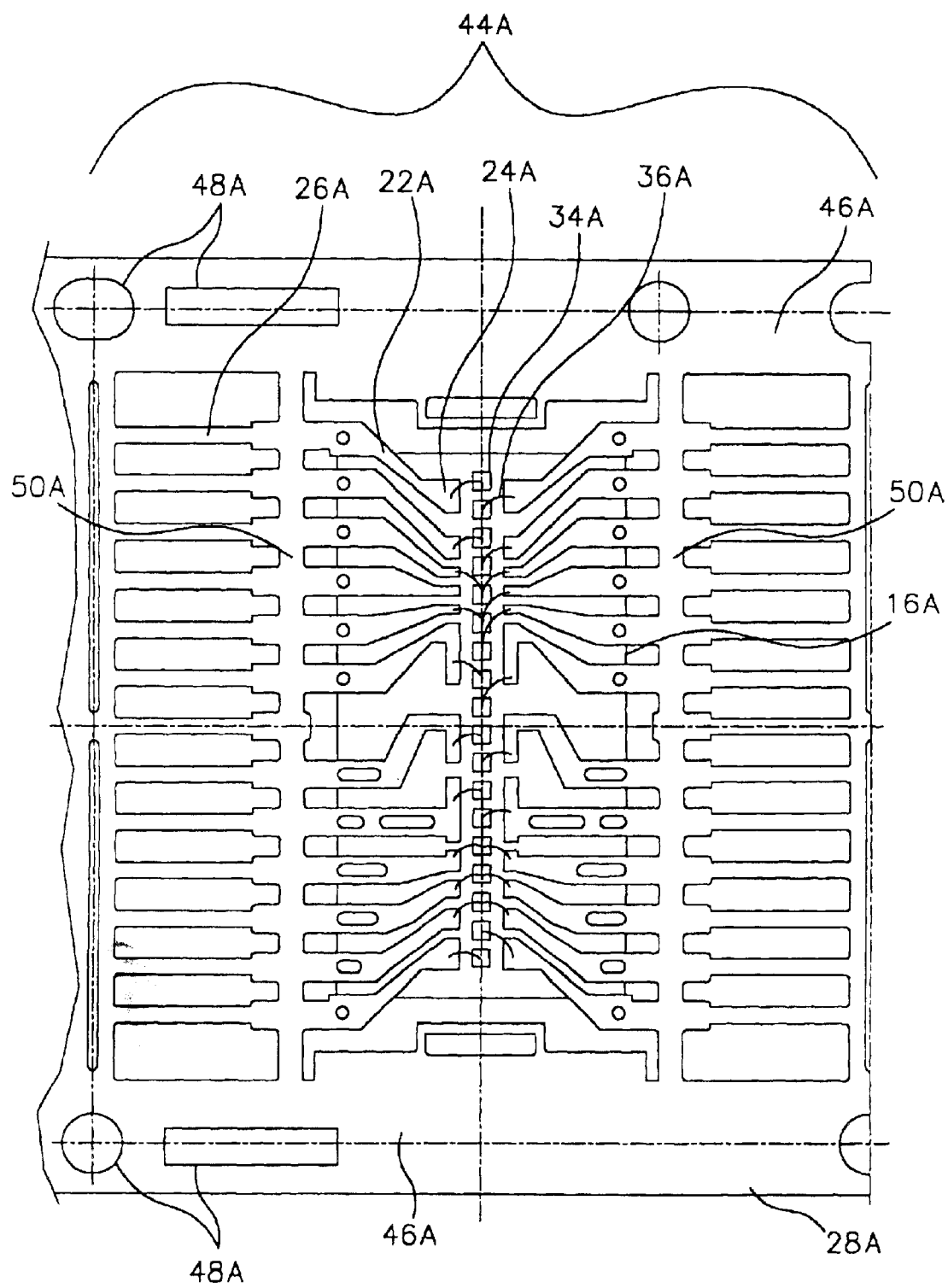
FIG. 5A is an enlarged cross sectional view taken along section line 5A—5A of FIG. 4A illustrating a segment of the first leadframe.
Figure 5B:
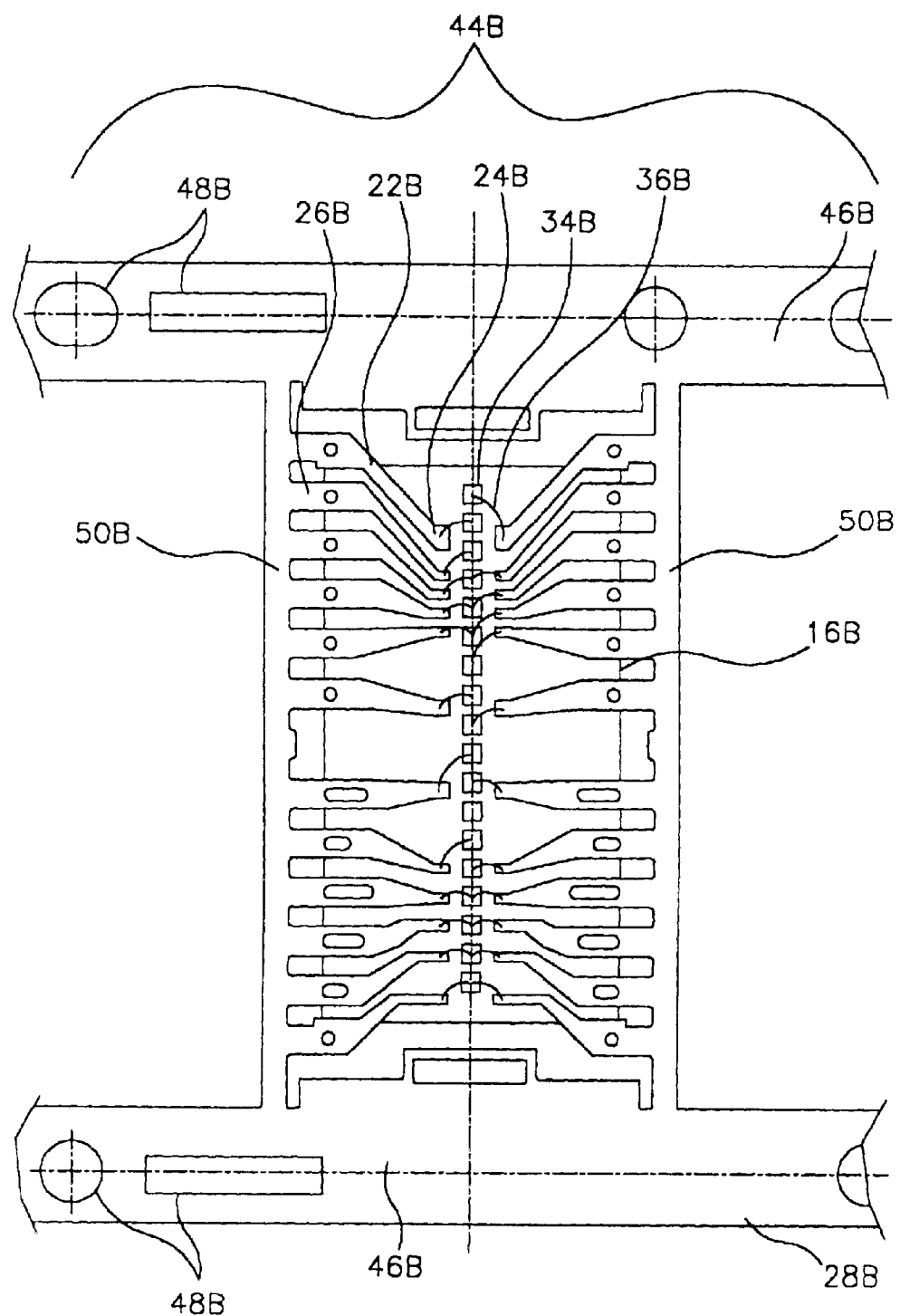
FIG. 5B is an enlarged cross sectional view taken along section line 5B—5B of FIG. 4A illustrating s segment of the second leadframe.

Referring to FIGS. 2A—2D, internal features of the package 10 are illustrated. The package 10 includes a first semiconductor die 16A attached to a first leadframe segment 18A. As will be further explained, the first semiconductor die 16A can comprise a LOC die, and the first leadframe segment 18A can comprise a singulated portion of a LOC leadframe 28A (FIG. 5A). The package 10 also includes a second semiconductor die 16B attached to a second leadframe segment 18B. As will be further explained, the second semiconductor die 16B can comprise a LOC die, and the second leadframe segment 18B can comprise a singulated portion of a modified LOC leadframe 28B (FIG. 5B)

A pair of adhesive layers 20A attach the first semiconductor die 16A to the first leadframe segment 18A. Similarly, a pair of adhesive layers 20B attach the second semiconductor die 16B to the second leadframe segment 18B. The adhesive layers 20A can comprise a curable die attach polymer such as an epoxy, an acrylic, or a polyimide material. The adhesive layers 20A can also comprise a tape material, such as a polyimide tape, having an adhesive material on one or both sides (e.g., "KAPTON" tape manufactured by DuPont). To improve heat transfer from the dice 16A, 16B the adhesive layers 20A, 20B can comprise a filled material such as silver filled silicone or epoxy.

The first leadframe segment 18A, in addition to being attached to the first semiconductor die 16A, is also attached to the second leadframe segment 18B. As will be hereinafter described, the first leadframe segment 18A can be attached to the second leadframe segment 18B using a suitable attachment process such as spot welding, brazing, soldering or application of a conductive adhesive.

Figure 2A:
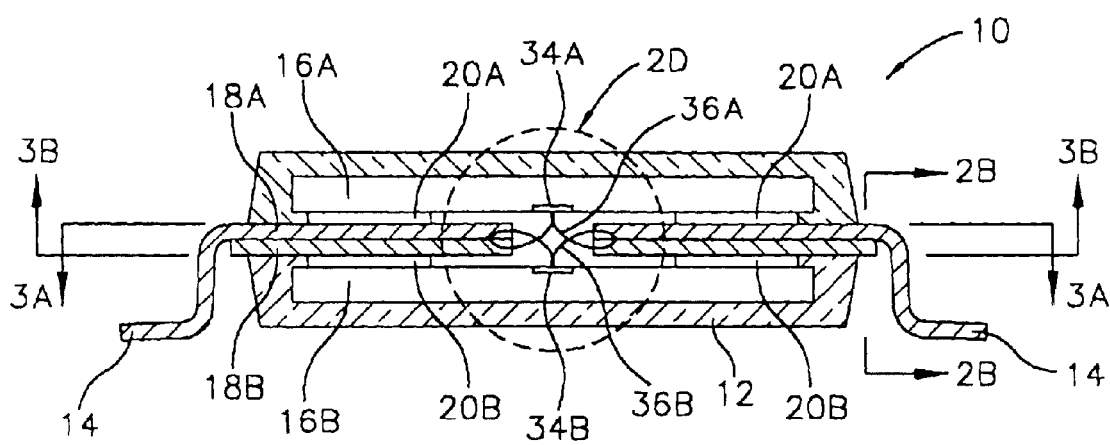
FIG. 2A is a cross sectional view of the package taken along section line 2A—2A of FIG. 1B.
Figure 3A:
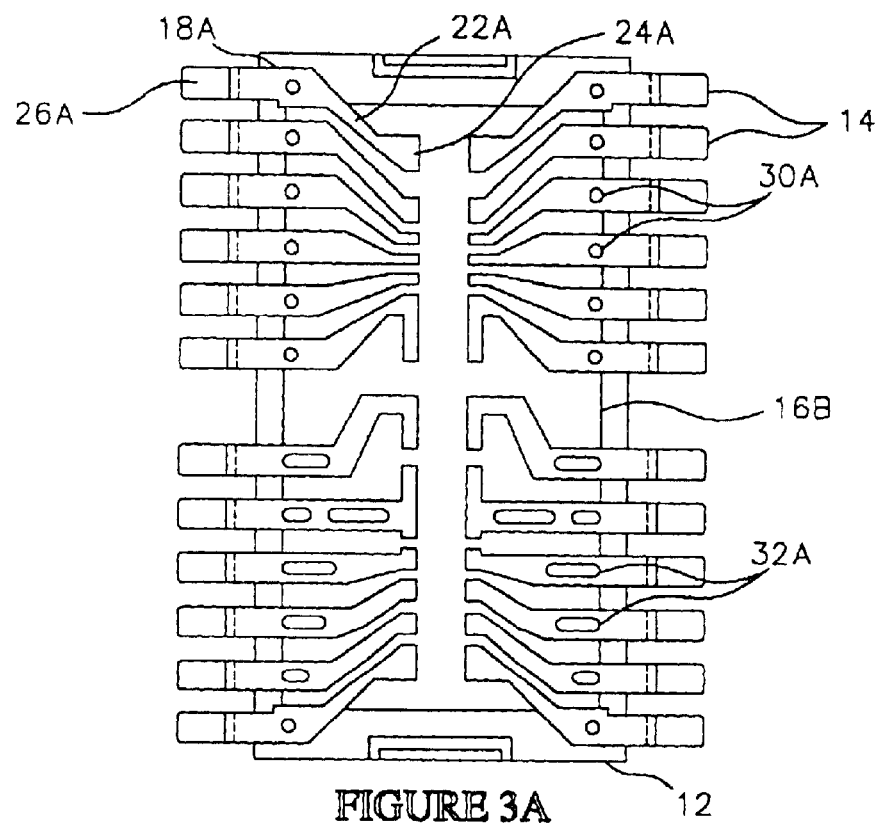
FIG. 3A is an enlarged cross sectional view taken along section line 3A—3A of FIG. 2A illustrating a first leadframe segment of the package.

As shown in FIG. 3A, the first leadframe segment 18A comprises a plurality of separate lead fingers 22A that form internal signal traces for the package 10. In addition, the lead fingers 22A support the die 16A during fabrication of the package 10, and provide a heat conductive path from the die 16A to the terminal leads 14 in the completed package 10. The lead fingers 22A include tip portions 24A having die attach surfaces attached to the face (circuit side) of the die 16A (FIG. 2A) by the adhesive layers 20A. Some of the tip portions 24A have an enlarged configuration to provide a larger die attach surface for supporting and anchoring the die 16A (FIG. 2A) to the lead fingers 22A. In addition, the tip portions 24A of the lead fingers 22A include through openings 30A and through slots 32A, configured to attach and anchor the adhesive layers 20A (FIG. 2A) to the lead fingers 22A.

Figure 2B:
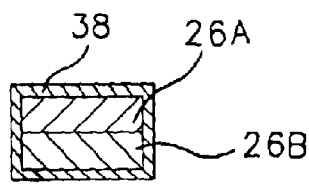
FIG. 2B is an enlarged cross sectional view taken along section line 2B—2B of FIG. 2A illustrating plated leads of the package.
Figure 2C:
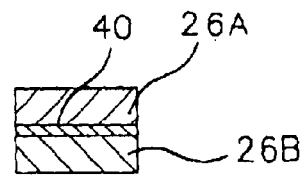
FIG. 2C is an enlarged cross sectional view equivalent to FIG. 2B illustrating alternate embodiment leads with a conductive adhesive layer therebetween.
Figure 2D:
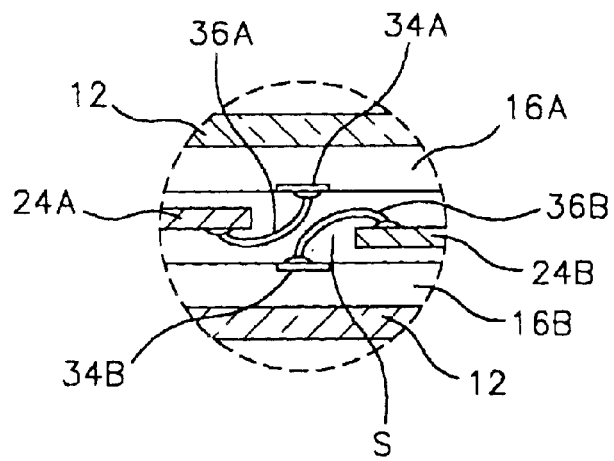
FIG. 2D is an enlarged cross sectional view taken along section line 2D of FIG. 2A illustrating spaced lead fingers on separate leadframe segments of the package.

As shown in FIG. 2D, in addition to being attached to the first semiconductor die 16A, the tip portions 24A of the lead fingers 22A include wire bonding surfaces that are wire bonded to bond pads 34A on the die 16A. Bond wires 36A are bonded to the wire bonding surfaces on the tip portions 24A of the lead fingers 22A, and to the bond pads 34A on the die 16A. The bond wires 36A are bonded to wire bonding surfaces on first major surfaces of the tip portions 24A, while the adhesive layers 20A and the die 16A are attached to die attach surfaces on second opposing major surfaces of the tip portions 24A.

The lead fingers 22A of the first leadframe segment 18A also include terminal portions 26A that form the terminal leads 14 for the package 10. As will be further explained, the terminal portions 26A can be shaped as required, to form the terminal leads 14 with a desired configuration using a conventional trim and from process. In the illustrative embodiment the terminal leads 14 have a gull wing configuration. Alternately the terminal portions 26A can be shaped to form the terminal leads 14 with any other desired configuration (e.g., J-bend, stand off, etc.).

Figure 3B:
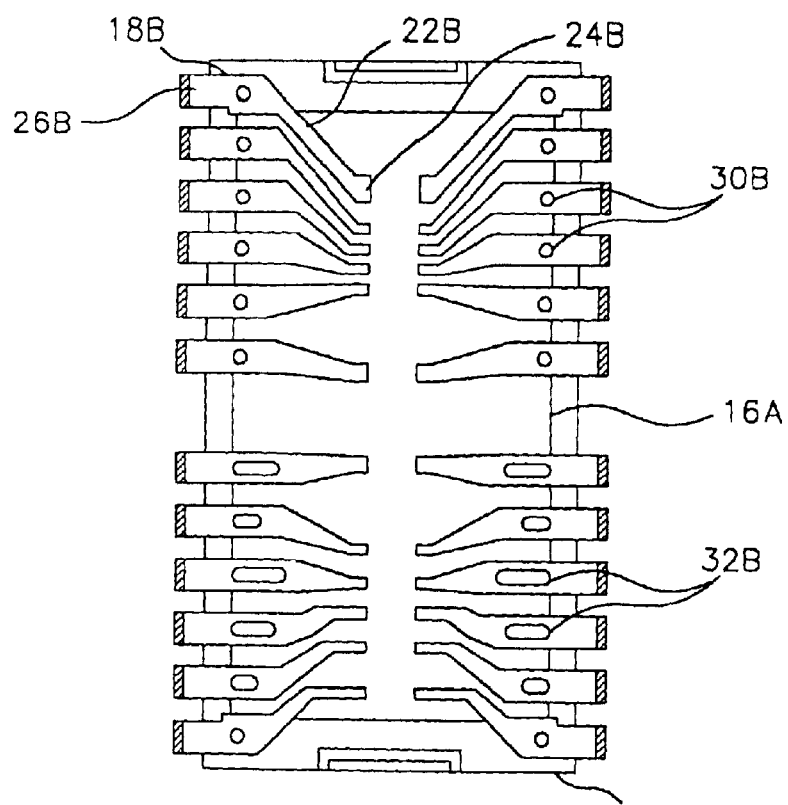
FIG. 3B is an enlarged cross sectional view taken along section line 3B—3B of FIG. 2A illustrating a second leadframe segment of the package.

As shown FIG. 3B, the second leadframe segment 18B comprises a plurality of separate lead fingers 22B that form internal signal traces for the package 10. The lead fingers 22B include tip portions 24B having die attach surfaces attached to the face (circuit side) of the second semiconductor die 16B (FIG. 2A) by the adhesive layers 20B (FIG. 2A). In addition, the tip portions 24B of the lead fingers 22B include through openings 30B and through slots 32B, configured to attach and anchor the adhesive layers 20B (FIG. 2A) to the lead fingers 22B. The lead fingers 22B support the die 16B during fabrication of the package 10, and provide a heat conductive path from the die 16B to the terminal leads 14 in the completed package 10.

As shown in FIG. 2D, in addition to being attached to the second semiconductor die 16B, the tip portions 24B of the lead fingers 22B include wire bonding surfaces wire bonded to bond pads 34B on the die 16B. Specifically, bond wires 36B are bonded to wire bonding surfaces on the tip portions 24B of the lead fingers 22B, and to the bond pads 34B on the die 16B. The bond wires 36B are attached to wire bonding surfaces on first major surfaces of the tip portions 24B, while the adhesive layers 20B and the die 16B are attached to die attach surfaces on second opposing major surfaces of the tip portions 24B.

As also shown in FIG. 2D, the tip portions 24B of the lead fingers 22B are staggered, or offset, with respect to the tip portions 24A of the lead fingers 22A, such that spaces S are formed therebetween. The spaces S are sized to provide clearance for the bond wires 36A and 36B in the completed package 10.

Figure 6:
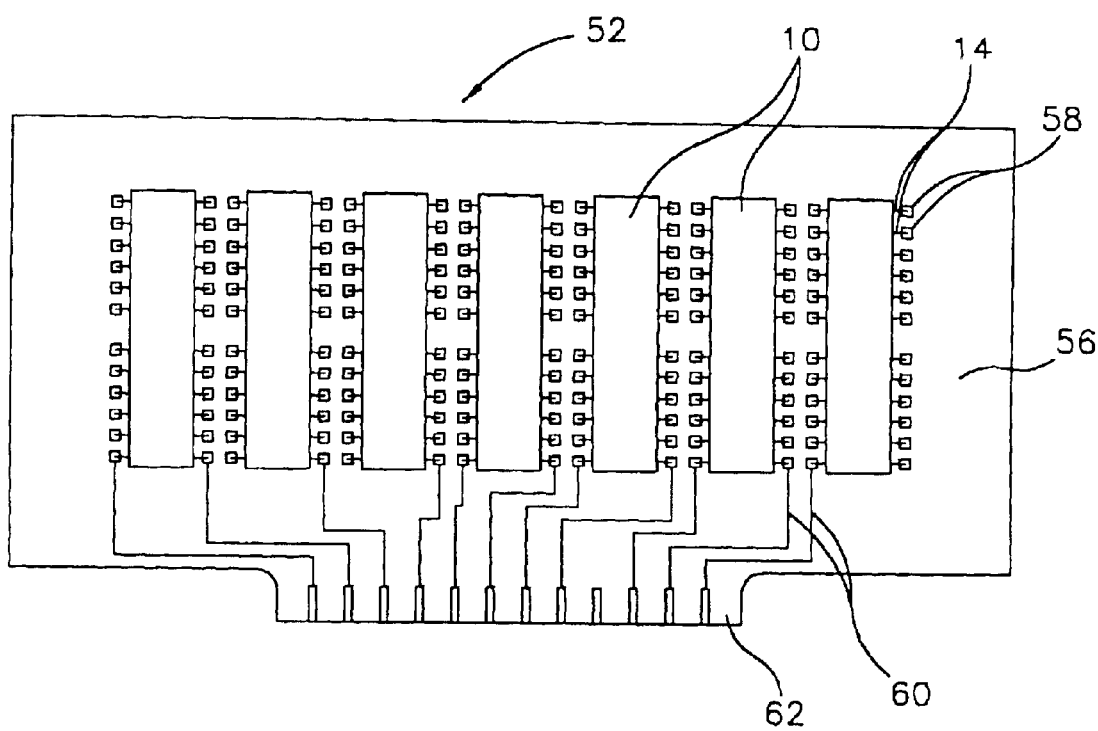
FIG. 6 is a plan view of an electronic assembly fabricated using multiple packages constructed in accordance with the invention.

As shown in FIG. 2B, the terminal portions 26B of the lead fingers 22B are in physical and electrical contact with the terminal portions 26A of the lead fingers 22A. An electrical path is thus provided from the bond pads 34B (FIG. 2A) on the second semiconductor die 16B to the terminal leads 14 (FIG. 2A) for the package 10. A metal layer 38 (FIG. 2B) can be deposited on the terminal portions 26A, 26B of the lead fingers 22A, 22B using a suitable deposition process (e.g., electro plating, electroless plating) to rigidify the physical and electrical bond between the lead fingers 22A, 22B. The metal layer 38 can also at least partially cover the terminal leads 14 of the package 10 to facilitate bonding to electrodes 58 (FIG. 6) on a supporting substrate 56 (FIG. 6). Suitable metals for, the metal layer 38 include solder, copper, silver, nickel, and gold.

Alternately, as shown in FIG. 2C, a conductive adhesive layer 40 can be formed between the terminal portions 26A, 26B of the lead fingers 22A, 22B. The conductive adhesive layer 40 can comprise an isotropic or anisotropic adhesive such as metal filled epoxy or silicone. As with the metal layer 38 (FIG. 2B), the conductive adhesive layer 40 rigidifies the physical and electrical bond between the terminal portions 26A, 26B of the lead fingers 22A, 22B on the different lead frame segments 18A, 18B of the package 10.

Figure 4A:
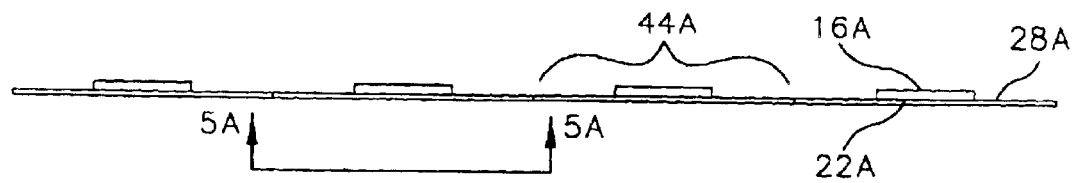
FIGS. 4A–4E are schematic cross sectional views illustrating steps in a method for fabricating the package.

Referring to FIGS. 4A–4E, steps in a method for fabricating the package 10 are illustrated. Initially, as shown in FIG. 4A, the first leadframe 28A is provided with a plurality of die mounting sites 44A. For illustrative purposes the leadframe 28A includes four die mounting sites 44A. However, a greater or less number of die mounting sites 44A can be provided.

The first leadframe 28A can have a conventional lead-on-chip configuration. In addition, the first leadframe 28A can comprise a suitable metal, such as an iron-nickel alloy, or a copper alloy. As shown in FIG. 5A, the leadframe 28A includes side rails 46A formed with various indexing holes 48A. The indexing holes 48A facilitate transport and handling of the leadframe 28A by automated packaging machinery. The leadframe 28A also includes sidebars 50A (or dam bars) for increased rigidity. As will be further explained, the siderails 46A, and the sidebars 50A, are trimmed away during a trim and form operation to follow.

As also shown in FIG. 5A, the leadframe 28A includes the lead fingers 22A having tip portions 24A that are bonded to the faces of the dice 16A by the adhesive layers 20A (FIG. 2A). The lead fingers 22B also include terminal portions 26A which will be formed into the terminal leads 14 (FIG. 1) for the package 10.

The dice 16A can be attached to the tip portions 24A of the lead fingers 22A using a conventional die attacher. The adhesive layers 20A (FIG. 2A) can comprise a curable polymer material, or strips of adhesive tape covered with an adhesive polymer. The die attacher is configured to apply the adhesive layers 20A to the lead fingers 22A, or dice 16A, and then to attach the dice 16A to the lead fingers 22A.

Following attaching of the dice 16A to the lead fingers 22A, the bond pads 34A on the dice 16A can be wire bonded to the tip portions 24A of the lead fingers 22A. A conventional wire bonder can be used to bond the bond wires 36A to the bond pads 34A and to the tip portions 24A of the lead fingers 22A. In addition, the bond wires 36A can be formed with a relatively short length as in a package fabricated with a conventional lead-on-chip leadframe.

Referring again to FIG. 4A, the second leadframe 28B is also provided with a plurality of die mounting sites 44B. The second leadframe 28B can comprise a modified lead-on-chip leadframe having the features to be hereinafter described. The leadframe 28B can comprise a suitable metal, such as an iron-nickel alloy, or a copper alloy. As shown in FIG. 5B, the leadframe 28B includes side rails 46B formed with various indexing holes 48B. The leadframe 28B also includes sidebars 50B (or dam bars) for increased rigidity.

As also shown in FIG. 5B, the leadframe 28B includes the lead fingers 22B having tip portions 24B that are bonded to the faces of the dice 16B by the adhesive layers 20B (FIG. 2A). In the completed package 10 (FIG. 1), the tip portions 24B of the lead fingers 22B are staggered with respect to the tip portions 24A of the lead fingers 22A on leadframe 28A, substantially as shown in FIG. 2D.

As also shown in FIG. 5B, the lead fingers 22B include terminal portions 26B that terminate at the side bars 50B. The terminal portions 26B of the lead fingers 22B are configured to physically and electrically contact the terminal portions 26A (FIG. 5A) of the lead fingers 22A of the first leadframe 28A.

The dice 16B can be attached to the lead fingers 22B using a conventional die attacher configured to apply the adhesive layers 20B and press the dice 16B against the lead fingers 22B. The adhesive layers 20B (FIG. 2A) can comprise a curable polymer material, or strips of adhesive tape covered with an adhesive polymer.

Following attaching of the dice 16B to the lead fingers 22B, the bond pads 34B on the dice 16B can be wire bonded to the tip portions 24B of the lead fingers 22B. A conventional wire bonder can be used to bond the bond wires 36B to the bond pads 34B and the tip portions 24B.

Figure 4B:
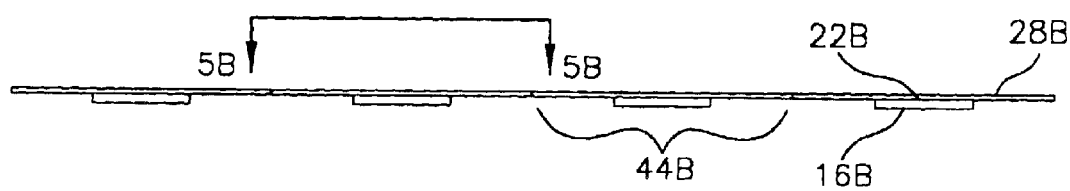

Referring to FIG. 4B, following attaching and wire bonding of the dice 16A, 16B to the leadframes 28A, 28B, the leadframes 28A, 28B can be attached to one another. The leadframes 28A, 28B can be attached with the terminal portions 26A, 26B of the leadfingers 22A, 22B in physical and electrical contact substantially as shown in FIG. 2B. In addition, the semiconductor dice 16A, 16B have their faces (circuit sides) facing one another, and their back sides facing outward in the completed package 10.

For attaching the leadframes 28A, 28B to one another, spot welds 42 can be made at suitable locations, such as along the side rails 46A, 46B (FIGS. 5A and 5B) or along select portions of the lead fingers 22A, 22B. Alternately, a conductive adhesive layer 40 (FIG. 2C) can be used to attach the leadframes 28A, 28B to one another. As another alternative to welding, attachment can be performed by brazing, or soldering the leadframes 28A, 28B. In the illustrative embodiment, the leadframes 28A, 28B are attached with the first leadframe 28A located above the second leadframe 28B. However, it is to be understood that the relative positions of the leadframes 28A, 28B can be reversed, such that the second leadframe 28B is on top.

Figure 4C:
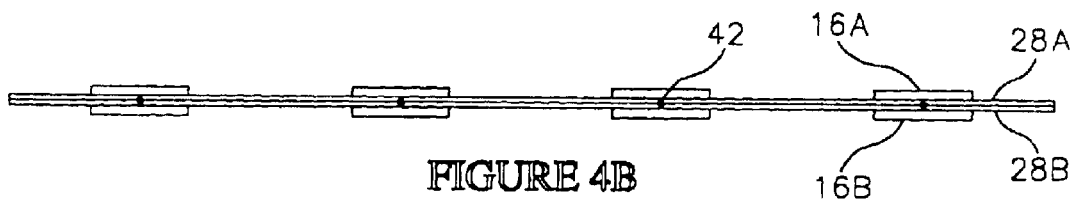

Referring to FIG. 4C, following the attachment step, the plastic bodies 12 can be formed on the leadframes 28A, 28B. The plastic bodies 12 can be formed using a conventional molding process. In addition, a conventional material such as an epoxy novolac resin, a silicone, a phenylsilane or a thermoset plastic, can be used to form the plastic bodies 12. The plastic bodies 12 encapsulate adjacent pairs of stacked dice 16A, 16B as well as the bond wires 36A, 36B (FIG. 2D) and the leadfingers 22A, 22B associated with the stacked dice 16A, 16B.

In the illustrative embodiment, the plastic bodies 12 have the configuration of a thin small outline package (TSOP). However, it is to be understood that the plastic bodies 20 can have other conventional configurations, as previously described. In addition, the plastic bodies 12 have a outer peripheral parting line that follows the surfaces of the terminal portions 26A, 26B of the leadfingers 22A, 22B. As with a conventional plastic package a single parting line is present.

Figure 4D:
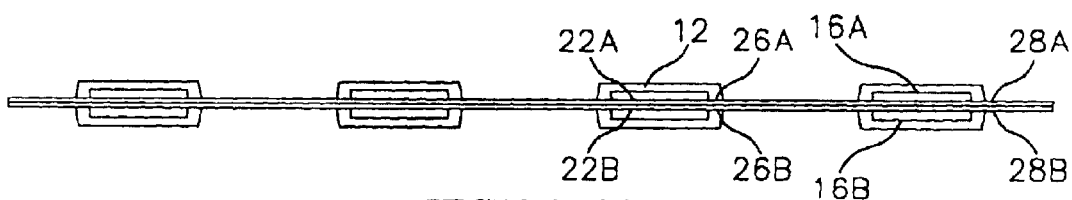

Referring to FIG. 4D, following formation of the plastic bodies 12, a trim step can be performed to trim the side rails 46A, 46B and the side bars 50A, 50B from the leadframes 28A, 28B. The trim step defines the separate leadframe segments 18A, 18B (FIG. 2A) in the completed package 10. The trim step can be performed using a conventional trim and form apparatus configured to trim both leadframes 28A, 28B are simultaneously.

Following the trim step, the terminal portions 26A, 26B of the lead fingers 22A, 22B can be plated with the metal layer 38 (FIG. 2B). The metal layer 38 can be plated using a suitable deposition process, such as electroplating or electroless plating. The metal layer 38 rigidifies the physical and electrical bond between the terminal portions 26A, 26B of the lead fingers 22A, 22B. In addition, the metal layer 38 can cover selected portions of the terminal leads 14 to facilitate bonding of the terminal leads 14 to a supporting substrate (e.g., substrate 56—FIG. 6). Plating of the metal layer 38 can also be performed prior to the trim step.

Figure 4E:
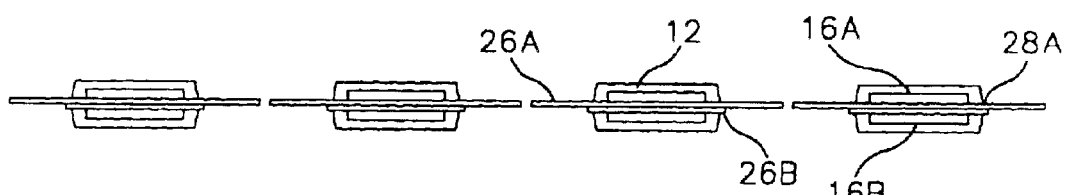

Referring to FIG. 4E, also following the trim step, the terminal portions 26A of the leadfingers 22A of the first leadframe 28A are formed into the package leads 14. The forming step can be performed using a conventional trim and form apparatus. In the illustrative embodiment, the terminal leads 14 of the packages 10 are formed in a gull wing configuration. Alternately, the terminal leads 14 can be formed in other standard configurations such as integral standoff, J-bend, or butt joint configurations.

In the completed package the terminal portions 26B of the leadfingers 22B on the second leadframe 28B are not visible as the package is viewed from above. However, it is to be understood that the leadframes 28A, 28A can be reversed in position relative to one another such that the terminal portions 26B of the leadfingers 22B are visible as the package is viewed from above.

Referring to FIG. 6, an electronic assembly 52 fabricated using multiple packages 10 constructed in accordance with the invention is illustrated. The electronic assembly 52 can be configured as a module, such as a memory module. The electronic assembly 52 includes a substrate 56 comprising a plurality of electrodes 58. The substrate 56 can comprise a glass filled resin, such as FR-4 or FR-5, a ceramic, silicon or other suitable material. The electrodes 58 can comprise a material such as solder, copper or nickel configured for bonding to the terminal leads 14 on the packages 10, using a suitable bonding process such as solder reflow.

The electronic assembly 52 also includes conductive traces 60 on the substrate 56 in electrical communication with the electrodes 58, and an edge connector 62 on the substrate 56 in electrical communication with the conductive traces 60. The edge connector 62 and conductive traces 60 provide separate electrical paths from the outside world to the electrodes 58 and terminal leads 14 on the packages 10.

Thus the invention provides an improved semiconductor package, a method for fabricating the package, and an improved electronic assembly fabricated using the package. The package includes a pair of semiconductor dice and provides improved heat transfer from the dice. In addition the package can be fabricated using conventional equipment and techniques.

While the invention has been described with reference to certain preferred embodiments, as will be apparent to those skilled in the art, certain changes and modifications can be made without departing from the scope of the invention as defined by the following claims.

What is claimed is:

1. A method for fabricating semiconductor packages comprising:

providing a first leadframe comprising a plurality of first leadframe segments having a plurality of first leads;

attaching a plurality of first semiconductor dice to the first leadframe segments;

providing a second leadframe comprising a plurality of second leadframe segments having a plurality of second leads;

attaching a plurality of second semiconductor dice to the second leadframe segments;

attaching selected first leads on the first leadframe segments to selected second leads on the second leadframe segments;

trimming the first leadframe segments and the second leadframe segments from the first Leadframe and the second leadframe;

forming conductive layers on the selected first leads and the selected second leads; and forming the first leads into terminal leads for the packages.

2. The method of claim 1 wherein the forming the conductive layers step comprises a plating process.

3. The method of claim 1 wherein the first leadframe and the second leadframe comprise lead-on-chip leadframes.

4. The method of claim 1 further comprising encapsulating the first semiconductor dice and the second semiconductor dice.

5. The method of claim 1 wherein the attaching the selected first leads step comprises forming a conductive adhesive layer between the selected first leads and the selected second leads.

6. The method of claim 1 wherein the conductive layers comprise a metal selected from the group consisting of solder, copper, silver, nickel, and gold.

7. A method for fabricating semiconductor packages comprising:

providing a first leadframe comprising a plurality of first leadframe segments having a plurality of first leads and a plurality of first semiconductor dice attached and wire bonded to the first leads;

providing a second leadframe comprising a plurality of second leadframe segments having a plurality of second leads and a plurality of second semiconductor dice attached and wire bonded to the second leads;

attaching selected first leads on the first leadframe segments to selected second leads on the second leadframe segments;

trimming the first leadframe segments and the second leadframe segments from the first leadframe and the second leadframe;

forming metal layers on the selected first leads and the selected second leads; and forming the selected first leads into terminal leads for the packages.

8. The method of claim 7 wherein the attaching step comprises welding, brazing or soldering.

9. The method of claim 7 wherein the metal layers comprise a metal selected from the group consisting of solder, copper, silver, nickel, and gold.

10. The method of claim 7 wherein the attaching step comprises forming conductive adhesive layers between the selected first leads and the selected second leads.

11. The method of claim 7 further comprising encapsulating the first semiconductor dice and the second semiconductor dice.

12. A method for fabricating semiconductor packages comprising:

providing a plurality of first dice and a plurality of second dice;

providing a first leadframe comprising a plurality of first leadframe segments having first leadfingers;

attaching and wire bonding the first dice to the first leadframe segments;

providing a second leadframe comprising a plurality of second leadframe segments having second leadfingers;

attaching and wire bonding the second dice to the second leadframe segments;

attaching selected first leadfingers to selected second leadfingers;

trimming the first leadframe segments and the second leadframe segments from the first leadframe and the second leadframe;

forming conductive layers on the selected first leadfingers and on the selected second leadfingers; and forming the first leadfingers into terminal leads for the packages.

13. The method of claim 12 wherein the first leadframe and the second leadframe comprise lead-on-chip leadframes.

14. The method of claim 12 wherein the conductive layers comprise a metal.

15. The method of claim 12 wherein the conductive layers comprise conductive adhesive layers.

16. The method of claim 12 further comprising encapsulating the first dice and the second dice.

17. A method for fabricating semiconductor packages comprising:

providing a plurality of first dice and a plurality of second dice;

providing a first leadframe comprising a plurality of first leadframe segments having a plurality of first leads;

attaching and wire bonding the first dice to the first leadframe segments;

providing a second leadframe comprising a plurality of second leadframe segments having a plurality of second leads;

attaching and wire bonding the second dice to the second leadframe segments;

trimming the first leadframe segments and the second leadframe segments from the first leadframe and the second leadframe;

forming conductive adhesive layers between selected first leads and selected second leads; and forming the first leads into terminal leads for the packages.

18. The method of claim 17 wherein the first leadframe and the second leadframe comprise lead-on-chip leadframes.

19. The method of claim 17 further comprising forming metal layers around the selected first leads and the selected second leads.

20. The method of claim 17 further comprising encapsulating the first dice and the second dice.

21. The method of claim 17 wherein the conductive adhesive layers comprise an isotropic adhesive or an anisotropic adhesive.

* * * * *

UNITED STATES PATENT AND TRADEMARK OFFICE
CERTIFICATE OF CORRECTION

PATENT NO.    : 6,858,467 B2
DATED         : February 22, 2005
INVENTOR(S)   : Walter Moden It is certified that error appears in the above-identified patent and that said Letters Patent is hereby corrected as shown below:

Column 8,
Line 42, change "Leadframe" to -- leadframe --.

Signed and Sealed this

Tenth Day of May, 2005

JON W. DUDAS
*Director of the United States Patent and Trademark Office*